United States Patent
Lin et al.

(10) Patent No.: US 9,760,754 B2
(45) Date of Patent: *Sep. 12, 2017

(54) PRINTED CIRCUIT BOARD ASSEMBLY FORMING ENHANCED FINGERPRINT MODULE

(71) Applicant: SunASIC Technologies, Inc., New Taipei (TW)

(72) Inventors: Chi-Chou Lin, New Taipei (TW); Zheng-Ping He, Taipei (TW)

(73) Assignee: SunASIC Technologies Inc., New Taipei (TW)

( * ) Notice: Subject to any disclaimer, the term of this patent is extended or adjusted under 35 U.S.C. 154(b) by 13 days.

This patent is subject to a terminal disclaimer.

(21) Appl. No.: 14/791,534

(22) Filed: Jul. 6, 2015

(65) Prior Publication Data

US 2017/0012142 A1    Jan. 12, 2017

(51) Int. Cl.
| | |
|---|---|
| *H01L 31/02* | (2006.01) |
| *H01L 27/14* | (2006.01) |
| *H01L 23/02* | (2006.01) |
| *G06K 9/00* | (2006.01) |
| *H01L 27/146* | (2006.01) |

(52) U.S. Cl.
CPC .... *G06K 9/00053* (2013.01); *H01L 27/14618* (2013.01); *H01L 2224/16225* (2013.01); *H01L 2224/18* (2013.01); *H01L 2224/32225* (2013.01); *H01L 2224/45144* (2013.01); *H01L 2224/48091* (2013.01); *H01L 2224/48227* (2013.01); *H01L 2224/48465* (2013.01); *H01L 2224/73204* (2013.01); *H01L 2224/73265* (2013.01)

(58) Field of Classification Search
CPC ......... H01L 27/14; H01L 31/02; H01L 21/48; H01L 23/29; H01L 23/02; H01L 31/18
USPC ........... 257/431–433, 680, E31.11, E31.117, 257/E31.127, 99, 443, 704, 790, 710, 257/724, E51.018, E25.03; 438/65, 26, 438/116

See application file for complete search history.

(56) References Cited

U.S. PATENT DOCUMENTS

| | | | | |
|---|---|---|---|---|
| 5,157,475 | A * | 10/1992 | Yamaguchi | H01L 21/56 257/679 |
| 6,909,178 | B2 * | 6/2005 | Sakamoto | H01L 21/4828 257/680 |
| 6,940,141 | B2 * | 9/2005 | Kinsman | H01L 27/14618 257/433 |
| 8,633,062 | B2 * | 1/2014 | Punzalan | H01L 23/49503 257/666 |
| 8,963,312 | B2 * | 2/2015 | Ho | H01L 24/49 257/686 |

(Continued)

*Primary Examiner* — Sheikh Maruf
(74) *Attorney, Agent, or Firm* — Che-Yang Chen; Law Offices of Scott Warmuth

(57) ABSTRACT

A Printed Circuit Board Assembly (PCBA) forming an enhanced fingerprint module is disclosed. The PCBA includes a Printed Circuit Board (PCB), an image sensing chip, at least one electrode and a protection layer. An opening in a first insulation layer and a second insulation layer of the PCB together form a sensor portion so that the image sensing chip can be packaged in the opening. Thus, the thickness of the enhanced fingerprint module can be thinner than other fingerprint modules provided by the conventional package methods.

18 Claims, 13 Drawing Sheets

(56) References Cited

U.S. PATENT DOCUMENTS

| | | | | |
|---|---|---|---|---|
| 2002/0167062 | A1* | 11/2002 | Narita | H01L 31/0203 257/433 |
| 2003/0141593 | A1* | 7/2003 | Zuniga-Ortiz | H01L 23/4334 257/750 |
| 2004/0155359 | A1* | 8/2004 | Shen | H01L 23/49816 257/782 |
| 2004/0195701 | A1* | 10/2004 | Attarwala | H01L 24/75 257/783 |
| 2006/0273435 | A1* | 12/2006 | Lin | H01L 27/14618 257/678 |
| 2007/0074899 | A1* | 4/2007 | Aonuma | H05K 3/44 174/260 |
| 2009/0001554 | A1* | 1/2009 | Otremba | H01L 24/33 257/708 |
| 2009/0294162 | A1* | 12/2009 | Jeong | H01L 21/563 174/260 |
| 2012/0091594 | A1* | 4/2012 | Landesberger | H01L 23/3121 257/774 |
| 2015/0091118 | A1* | 4/2015 | Sato | H01L 23/13 257/432 |
| 2015/0340399 | A1* | 11/2015 | Kim | H01L 27/14618 257/433 |
| 2016/0049526 | A1* | 2/2016 | Oganesian | H01L 31/02002 257/434 |
| 2016/0204155 | A1* | 7/2016 | Park | H01L 27/14636 257/432 |

* cited by examiner

PRINTED CIRCUIT BOARD ASSEMBLY FORMING ENHANCED FINGERPRINT MODULE

FIELD OF THE INVENTION

The present invention relates to a Printed Circuit Board Assembly (PCBA). More particularly, the present invention relates to a PCBA with an image sensor mounted thereon, forming an enhanced fingerprint sensing module.

BACKGROUND OF THE INVENTION

A silicon chip, or Integrated Circuit (IC), is the core element of an electronic device and usually comes in packaged form. With the development of manufacturing technology and requirement of compact design for end products, various packaging methods were invented to meet the demand. Generally, silicon chips are sealed within a protective material such as a molding compound. There are certain cases, particularly when the silicon chip is a sensor device such as a fingerprint sensor chip embedded in a cellular phone or smart card, that the silicon chip needs to be mount on a substrate and has a surface exposed. Meanwhile, for a fingerprint reader device, the thickness of the packaged sensor must be reduced, and the surface should be maintained flat whenever possible. Several techniques, such as wire bonding, flip chip, and other non-conventional packaging methods, are used to package a fingerprint sensing chip now. However, none of them meets all the requirements: flatness of the top surface, thickness of the package, rigidness between the fingerprint sensing chip and the package material, and good circuit connectivity.

Conventional wire bonding is sometimes used to address the above requirements. Please refer to FIG. 1. A chip 1 in form of a die is mounted on a Printed Circuit Board (PCB) 2. There are many bonding pads 3 on one surface of the chip 1. Some connectors 4 are arranged on the PCB 2. By wire bonding, gold or aluminum wires 5 are formed to link the related bonding pads 3 and the connectors 4. In order to fix the chip 1 to the PCB 2, a layer of adhesive (not shown) may be applied on the interface between the chip 1 and the PCB 2. In general, the height of the gold wires 5 over the PCB 2 will occupy certain space above the chip surface. Moreover, when the chip 1 and the wires 5 are sealed in molding compound to protect the circuit while maintaining a flat surface, the molding compound above the chip must be thicker than the height of the bonding wires 5. The extra sealing material above the sensing surface will cause significant performance degrade. For the electronic devices whose thickness and surface flatness are much concerned, apparently, the wire bonding for the chip 1 and the PCB 2 is not appropriate.

Flip chip technology is another widely used packaging method for interconnecting between a die and a PCB. Processing a flip chip is similar to the conventional IC fabrication, with a few additional steps. Please refer to FIG. 2. Around the end of the manufacturing process, the attachment pads 12 of a chip 11 are metalized to make them more receptive to solders. It typically consists of several treatments. Small dots of solder balls 13 are then deposited on each metalized pad 12. The chips 11 are then cut out of a wafer as normal. To attach the flipped chips 11 onto a PCB 14, the chip (die) 11 is inverted to bring the solder balls 13 down onto connectors 15 on the underlying PCB 14. The solder balls 13 are then re-melted to produce an electrical connection, typically using a thermosonic bonding or alternatively using a reflow solder process. This also leaves a small space between the chip's circuitry and the underlying mounting surface. In most cases, an electrically-insulating adhesive 16 is then underfilled to provide a stronger mechanical connection. However, to provide good circuit connectivity and rigidness, the size of the solder balls 13 cannot be reduced. Moreover, the difference in height between the top surface of the chip 11 and that of the underlying PCB 14 cannot be removed when the flip chip technology is applied. Therefore, the flip chip technology is not a proper packaging method for thickness and surface flatness is concerned.

U.S. Pat. No. 7,090,139 of Kasuga et al. discloses a smart card including a fingerprint sensor attached to a thin wiring film, and having a window or opening above the sensing surface to expose the sensing surface. The fingerprint sensor is sandwiched by two substrates, and the electrical connection between the sensor and the wiring film is achieved by anisotropic conductive films. Certainly, an obvious step, caused by the height of the substrate above the sensor and the height of the anisotropic conductive film, exists between the top surface of the smart card and that of the sensor. Thus, even though the smart card packaging method provided by Kasuga et al. meets the thickness requirement of a smart card, a flat top surface cannot be achieved.

A packaging of a fingerprint sensor and a method thereof, such as disclosed by U.S. Pat. No. 8,736,001, is shown in FIG. 3. The finger sensor 30 includes a substrate 35, a finger sensing IC 34 mounted on the substrate 35, and bond wires 32 coupling the substrate 35 and the finger sensing IC 34. The finger sensing IC 34 includes a finger sensing area on an upper surface thereof. The finger sensor 30 includes an encapsulating layer 33 encapsulating the finger sensing IC 34 and covering the finger sensing area. The encapsulating layer 33 includes a recessed portion 37 for receiving the finger of the user. The encapsulating layer 33 also includes a peripheral flange portion 38 on the substrate 35 and surrounding the finger sensing IC 34 and the bond wires 32. The finger sensor 30 includes a bezel 31 on the encapsulating layer 33. The bezel 31 may be coupled to circuitry to serve as a drive electrode for driving the finger of the user. The finger sensor 30 includes conductive traces 36 on the substrate 35 for coupling the bezel 31 thereto. The bezel 31 may comprise a metal or another conductive material. In some examples, ESD protection circuitry may be coupled to the bezel 31. That the bezel 31 is affixed on an uppermost surface of the encapsulating material (at the level higher than that of the highest point of the bond wire) means that a step between the surface of the sensing area and top surface of the bezel is subject to the loop height of the bond wire, which is around 100 µm in normal cases. Thus, the usage of the bezel 31 may protect the finger sensing IC 34 from mechanical and/or electrical damages, the bezel 31 is not suitable for the products that are needed to be flat and/or thin, such as a smart card or a smart phone.

Also, U.S. Pat. No. 8,933,781 of Desnoyers et al. discloses additional electrically conducting surface parts positioned adjacently to the sensitive surface of the sensor in a smart card to enhance the signal received by the fingerprint sensor. No particular method of the connection between the sensor and the circuit in the smart card mentioned implies some conventional linkage method is used. Using conventional linkage method and the lack of emphasis on the flatness of the packaging implies that not only the flatness of the top surface but a thicker protective coating layer for ESD is the purpose of '781.

Both the bezel mentioned in U.S. Pat. No. 8,736,001 and the electrically conducting surface mentioned in U.S. Pat. No. 8,933,781 are exposed to environment. Although the bezel combines the driving electrode with ESD protective circuitry, it is still an exposed element. There are two disadvantages. First, size of the human body makes an antenna like device that can pick up radiation signals which may interfere with the fingerprint sensing function. Secondly, from the industrial design point of view, exposed conductive material, such as a reflective metal surface, may not be the choice of the designer, i.e. the designer may want to choose any suitable color or grain.

Furthermore, U.S. Pat. No. 8,736,080 of Arnold et al. discloses a low profile integrated circuit assembly which comprises: an integrated circuit, a substrate where the integrated circuit is disposed on, a conductive layer disposed in the signal trench and coupling to an integrated circuit signal pad, a bond wire configured to couple the conductive layer to an external pad. The substrate comprises at least one signal trench which is proximate to the integrated circuit signal pad and extending to one edge of the substrate. The bond wire, the at least one signal trench and the conductive layer are formed below a surface plane of the integrated circuit. This method successfully reduces the height of the package, and further provides a flat top surface. This method may provide an Integrated Circuit assembly having a flat top surface. However, the manufacturing processes, involving a deep etching step to form the trench and an additional metal plating step to form the conductive layer, require more manufacture time and additional cost.

Therefore, a low-cost and improved PCBA structure with a flat top surface, an embedded signal transmitting part(s), and a chip, especially a fingerprint sensor chip, mounted on a PCB over an opening is still desired. More particularly, both the embedded signal transmitting part(s) and the chip are sealed under a single protection layer which forms a flat top surface.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a printed circuit board assembly (PCBA) forming an enhanced fingerprint module is disclosed. The PCBA includes: a Printed Circuit Board (PCB), including: a first insulation layer having an opening formed therein; a first electrically conductive layer, forming a first specific circuit on a portion of a top surface of the first insulation layer and forming a plurality of contacts; a second electrically conductive layer, forming a second specific circuit on a portion of a bottom surface of the first insulation layer; a second insulation layer, formed below the second electrically conductive layer, wherein the second specific circuit is formed on a portion of a top surface of the second insulation layer; and a third electrically conductive layer, forming a third specific circuit on a portion of a bottom surface of the second insulation layer; an image sensing chip, having a sensing area and a plurality of bonding pads on a top surface thereof, fixed in the opening with the sensing area facing external environment and each bonding pad connected to one corresponding contact; at least one electrode, formed close-to or around the opening in the first electrically conductive layer, for providing an excitation signal to an object which has a detected surface being detected by the image sensing chip; and a protection layer, formed completely over the at least one electrode and the top surface of the image sensing chip, and formed partially or completely over the top surface of the first insulation layer and a top surface of the first electrically conductive layer. The opening in the first insulation layer and the second insulation layer together form a recessed sensor portion on the PCB. The protection layer forms a flat top surface of the printed circuit board assembly (PCBA) over the image sensing chip and the at least one electrode.

According to the present invention, the excitation signal is a capacitively coupled excitation signal sent out from the image sensing chip to the object through the at least one electrode. The at least one electrode has a total contact area larger than 20 $mm^2$. The at least one electrode may be a metal strip, metal strips, or a metal ring.

The bonding pad and a corresponding contact are connected by an electrically conductive material. The electrically conductive material may be thermal cured conductive paste or solder paste. The thermal cured conductive paste may be silver paste, copper paste, or nickel paste. The bonding pad and a corresponding contact are connected by metal plating. Gaps between sidewalls of the opening and peripherals of the image sensing chip are filled by an electrically non-conductive material. The electrically non-conductive material is epoxy resin.

The protection layer may be formed by an electrically non-conductive material. The electrically non-conductive material is epoxy resin. The protection layer may be made of organic coating material.

The image sensing chip is a fingerprint reader sensor chip. The image sensing chip has a low-power design with a wake-up function. The shape of the first opening is the similar to that of the image sensing chip but large enough in size so that the image sensing chip is able to be allocated in the opening.

Preferably, a step gap between a level of the top surface of the image sensing chip and that of the first insulation layer and/or the first electrically conductive layer after the image sensing chip is fixed into the sensor portion is less than 0.1 mm.

In accordance with another aspect of the present invention, a method for manufacturing the PCBA mention above includes the steps of: providing the PCB; providing the image sensing chip; gluing the sensor portion; placing the image sensing chip into the sensor portion; filling the gap between the sidewalls of the opening and the image sensing chip with the electrically non-conductive material; forming circuit patterns linking associated bonding pad and contact by the electrically conductive material; and forming the protection layer.

DETAILED DESCRIPTION OF THE PREFERRED EMBODIMENTS

The present invention will now be described more specifically with reference to the following embodiments.

Figure 1:
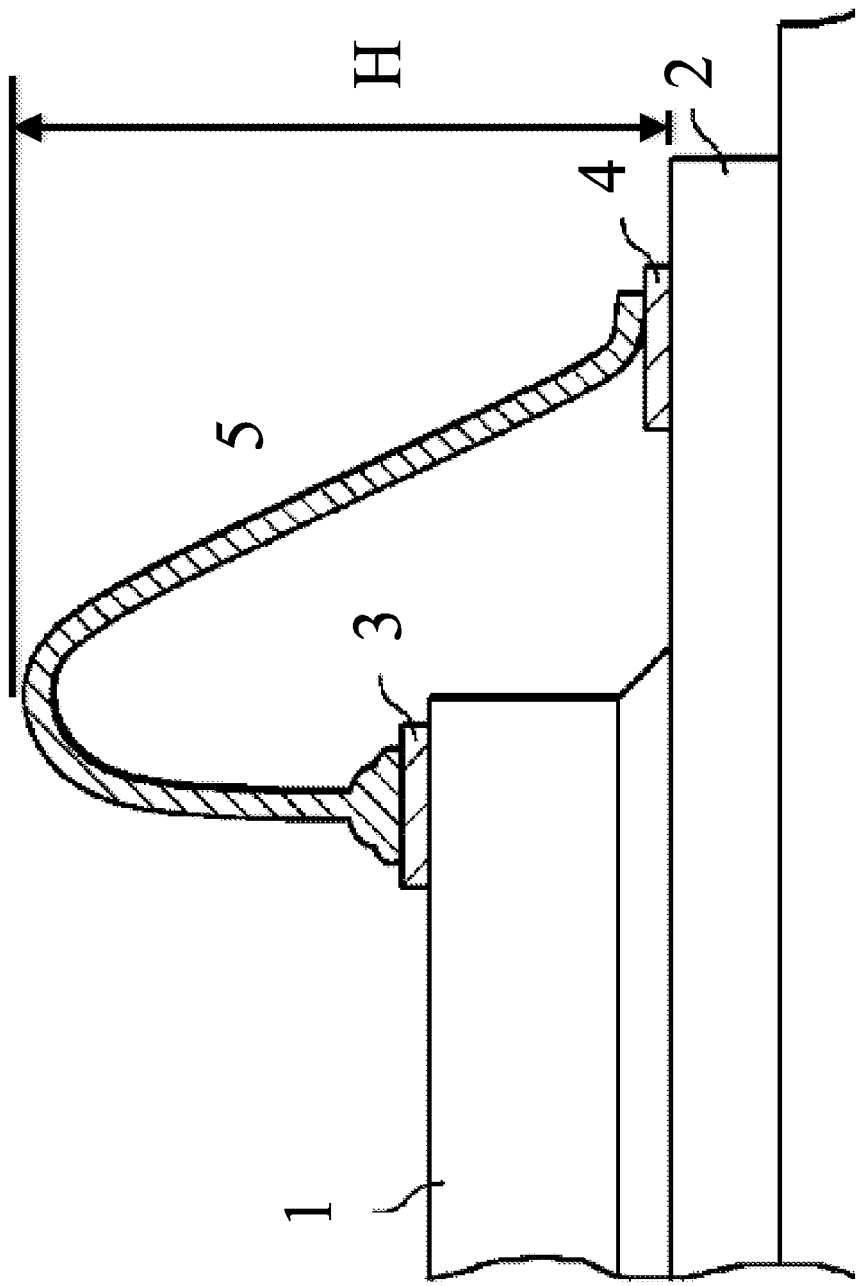
FIG. 1 is used to illustrate a conventional wire bonding process.
Figure 2:
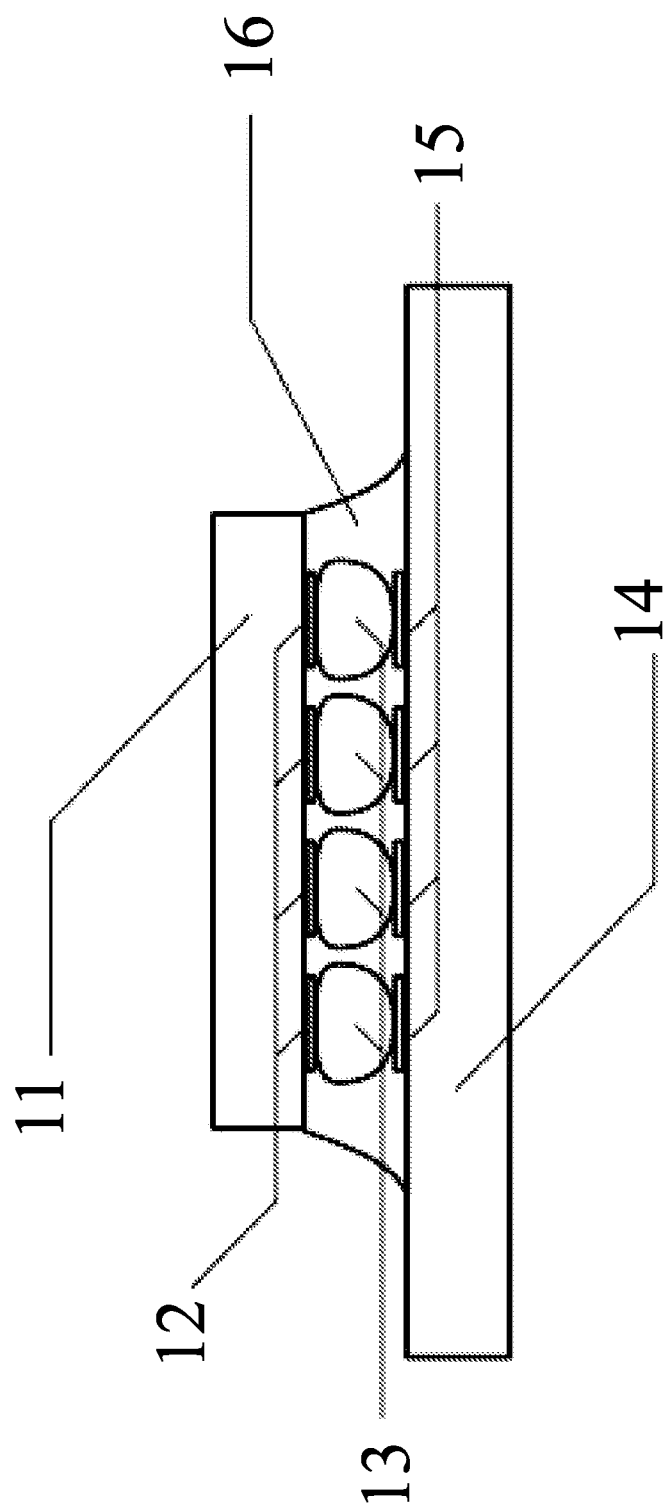
FIG. 2 is used to illustrate a conventional flip chip technology process.
Figure 3:
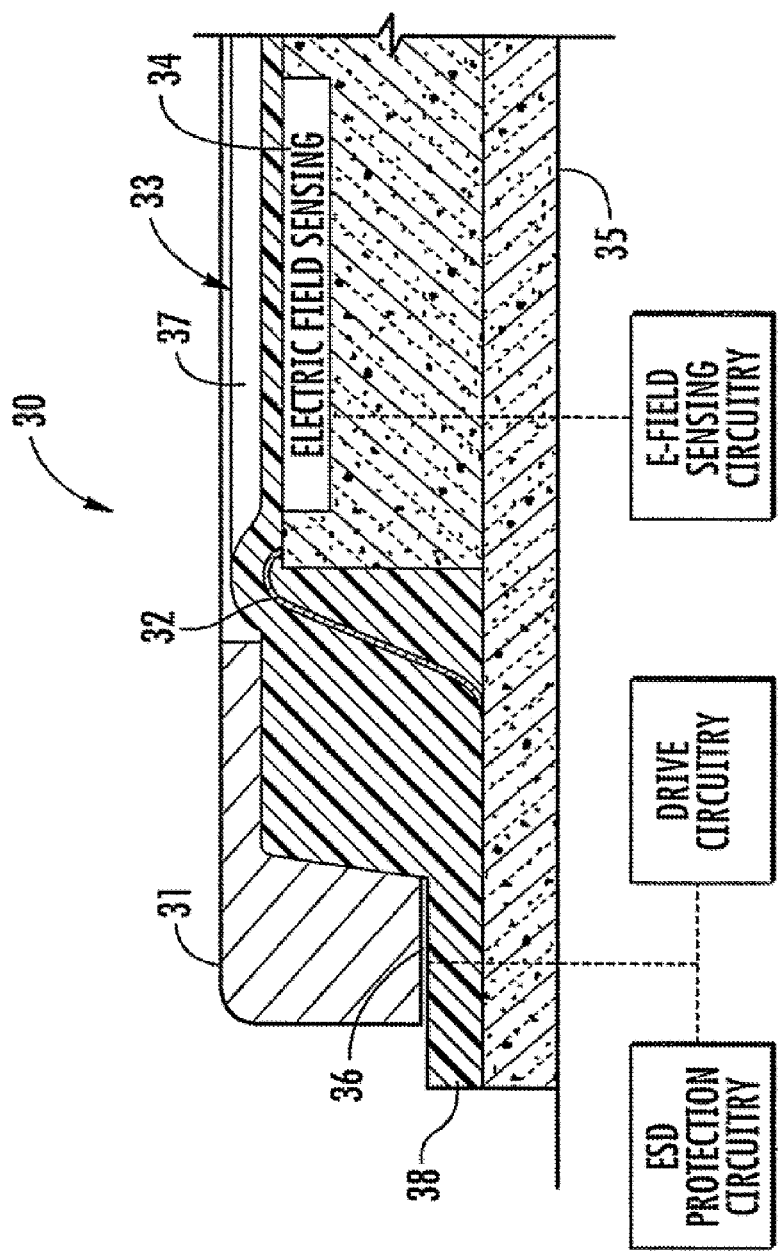
FIG. 3 shows a cross-sectional view of the finger sensor in a prior art.
Figure 4:
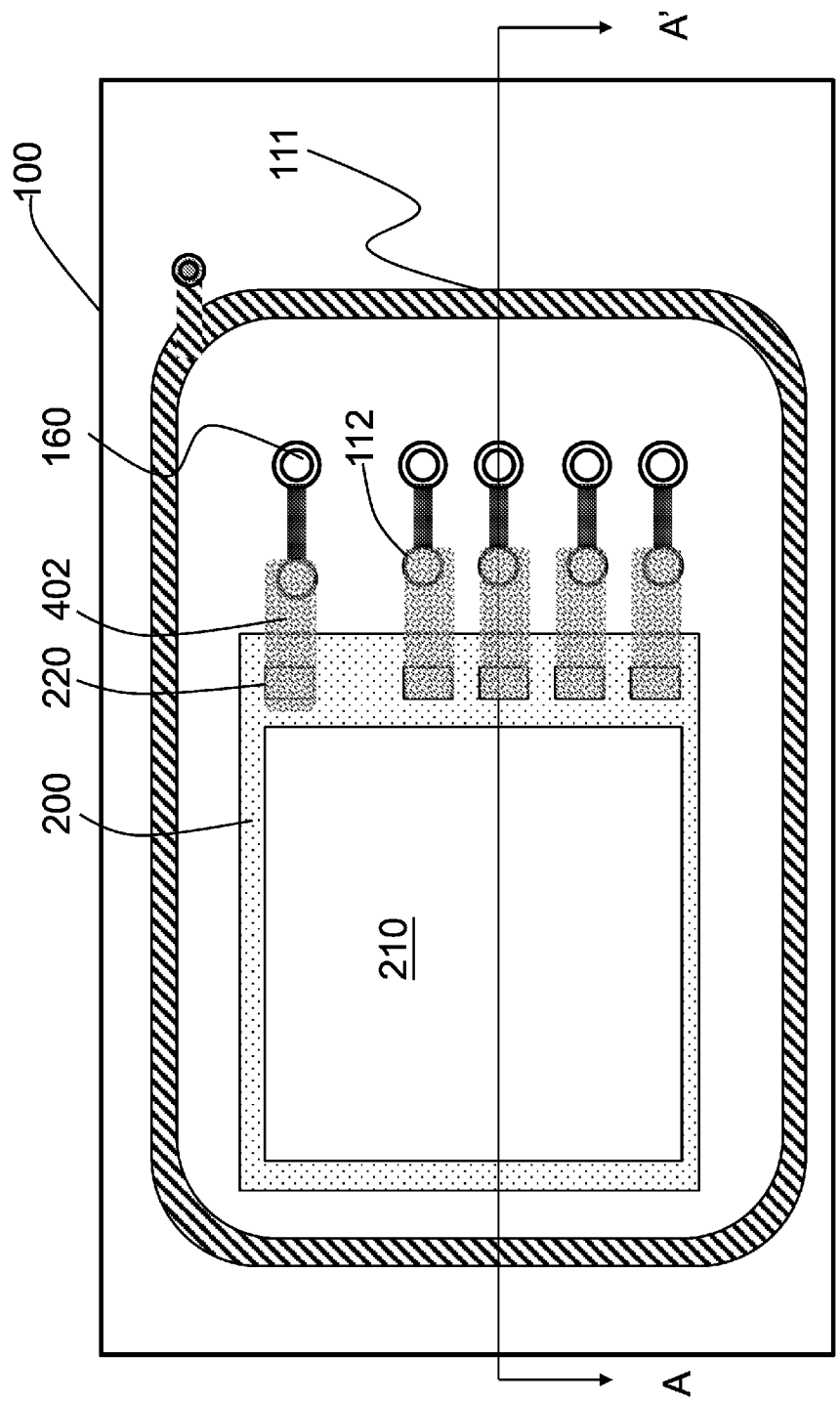
FIG. 4 is a top view of an embodiment of a printed circuit board assembly including an image sensing chip according to the present invention.
Figure 5:
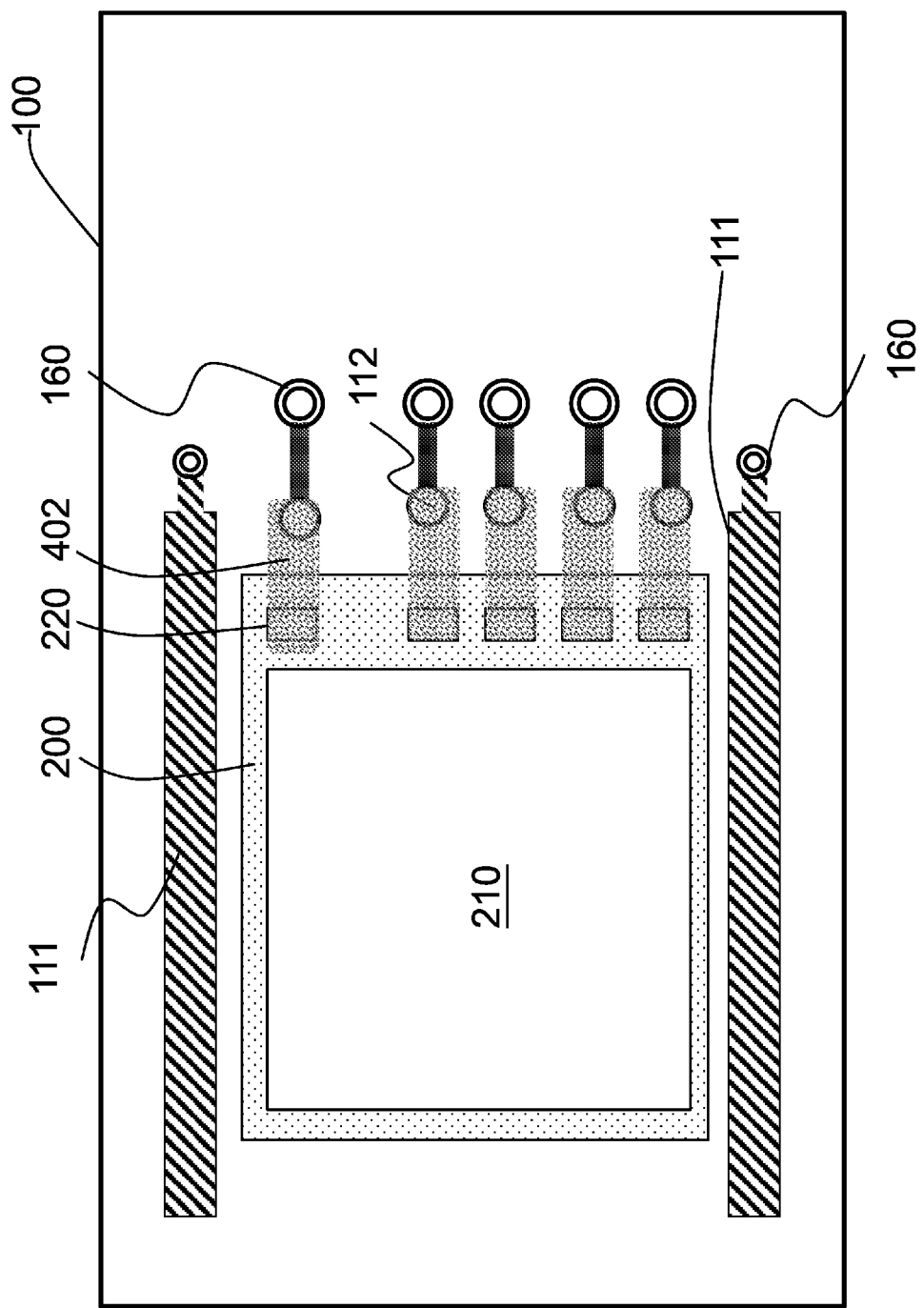
FIG. 5 is a top view of another embodiment of a printed circuit board assembly including an image sensing chip according to the present invention.

Please refer to FIG. 4 to FIG. 13. FIG. 4 is a top view of a printed circuit board assembly (PCBA). The PCBA includes a Printed Circuit Board (PCB) 100 and an image sensing chip 200. There are many image sensing chips can be used. In this embodiment, the image sensing chip 200 is a fingerprint reader. The image sensing chip 200 may further includes a metal grid (not shown) formed inside, for providing ESD protection for itself. Please notice that the sketches in the drawings may not be made according to the proportion. They are used for illustration only. The image sensing chip 200 may occupy less space than the PCB 100 in the PCBA. It should be noticed that in FIG. 4, a cross-sectional line AA' is marked. For a better understanding, the cross section cut by line AA' is used for illustration in some following drawings.

Figure 6:
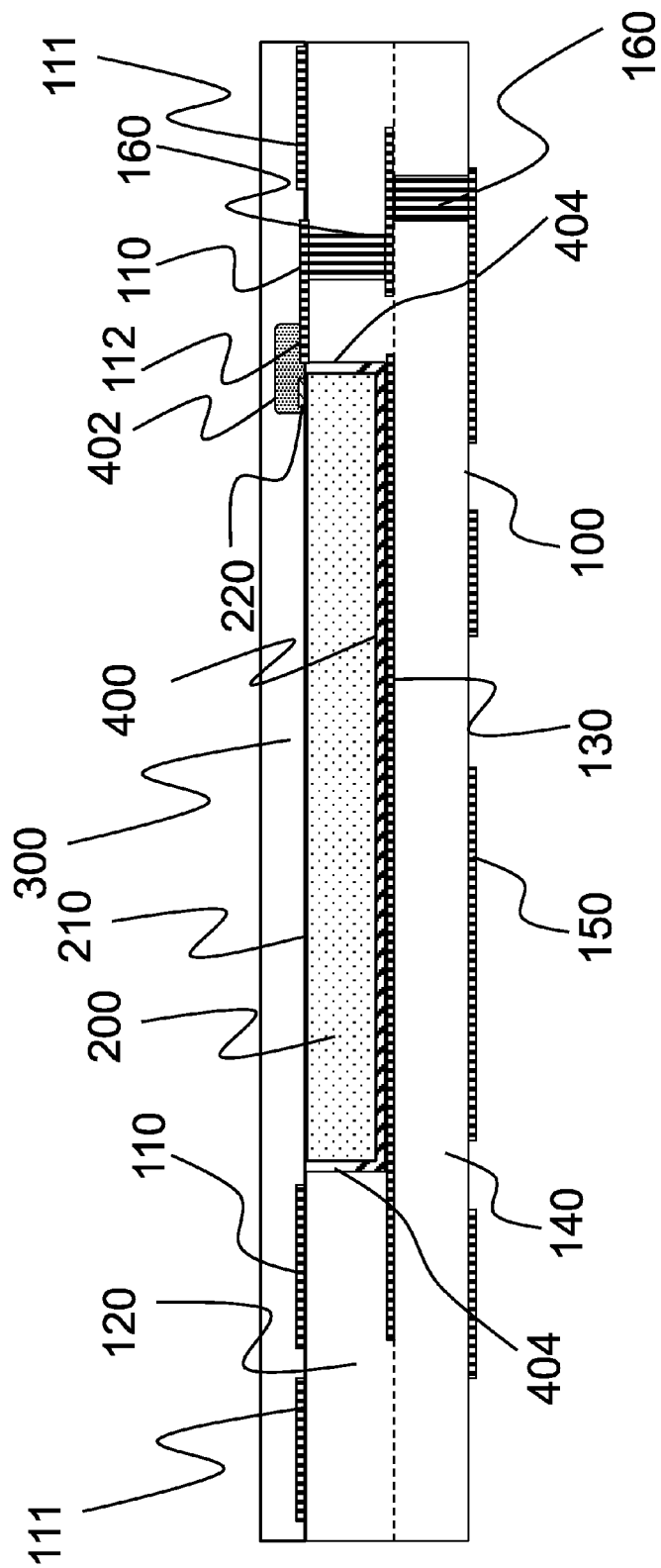
FIG. 6 is a cross-sectional view of the printed circuit board assembly.

Since the PCBA works as a fingerprint reader module, the PCB 100 has several key parts. Please see FIG. 6, FIG. 6 is a side view of the PCBA along the cross-sectional line AA' in FIG. 4. The key parts are a first electrically conductive layer 110, a first insulation layer 120, a second electrically conductive layer 130, a second insulation layer 140 and a third electrically conductive layer 150 shown in sequence from top to bottom in FIG. 6. The first electrically conductive layer 110 forms a first specific circuit on a portion of a top surface of the first insulation layer 120. As one can see, the first electrically conductive layer 110 shown in FIG. 6 is in form of discontinuous conductors. The conductors are made of copper or other metals, such as alloys. Although the conductors are not connected to each one in the cross section, they are linked to form the first circuit when the first electrically conductive layer 110 is taken out from the PCB 100. Circuit layout is a common technique. It is not described here. It should be noticed that the second electrically conductive layer 130 and the third electrically conductive layer 150 have similar structure and are illustrated in the same way. In addition, an electrical link between the first electrically conductive layer 110 and the second electrically conductive layer 130, or that between the second electrically conductive layer 130 and the third electrically conductive layer 150 can be achieved by vias 160.

The first electrically conductive layer 110 contains both the first specific circuit and at least one electrode 111. Please refer to FIG. 4, FIG. 6 and FIG. 8. The contacts 112 are formed from the first specific circuit and around an opening 122 (please refer to FIG. 8), and are used to electrically connect to the bonding pads 220 in the image sensing chip 200. There is one electrode 111 in the embodiment and it is formed around the opening 122 in the first electrically conductive layer 110. Function of the electrode 111 is to provide an excitation signal to an object which has a detected surface being detected by the image sensing chip 200. The shape of the electrode 111 may vary. For example, the electrode 111 is a metal ring as shown in FIG. 4. It can also be a metal frame enclosing the opening 122. According to the spirit of the present invention, the number of the electrode 111 is not limited to one and the electrode 111 can be close-to the opening 122. In another embodiment shown in FIG. 5, there are two electrodes 111 in the form of metal strips parallel to each other.

Figure 7:
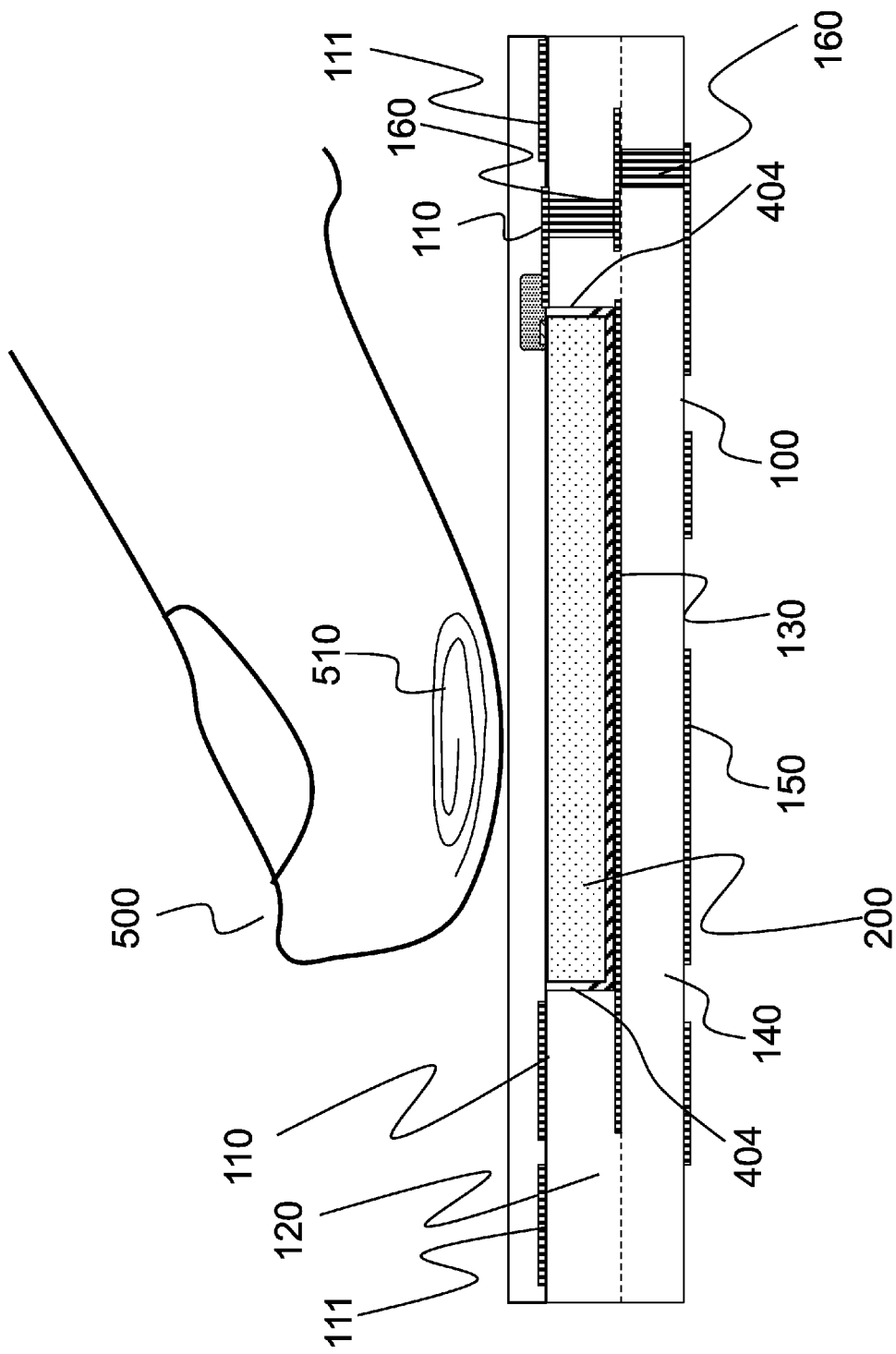
FIG. 7 is a side view of the printed circuit board assembly and an object which has a detected surface being detected by the image sensing chip.
Figure 8:
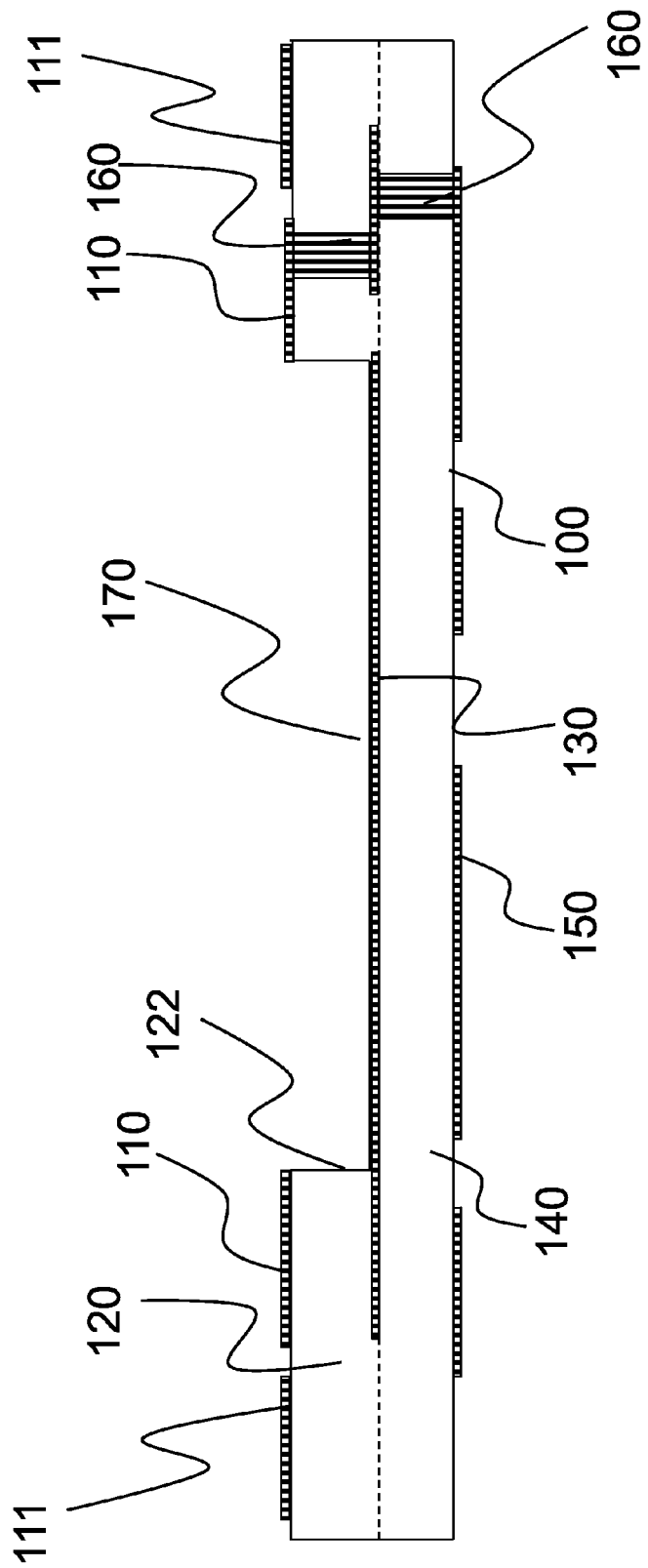
FIG. 8 to FIG. 12 are used to illustrate each step in a procedure of manufacturing the printed circuit board assembly.
Figure 9:
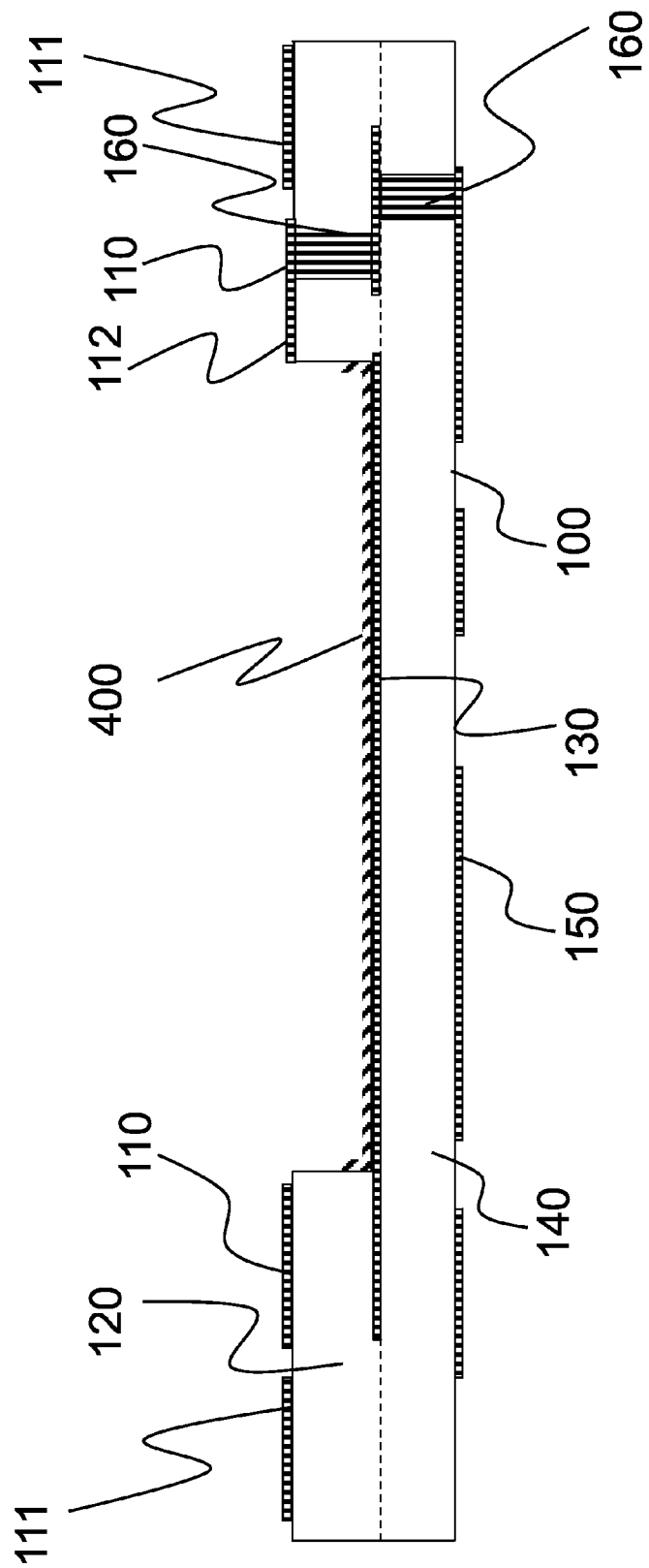
Figure 10:
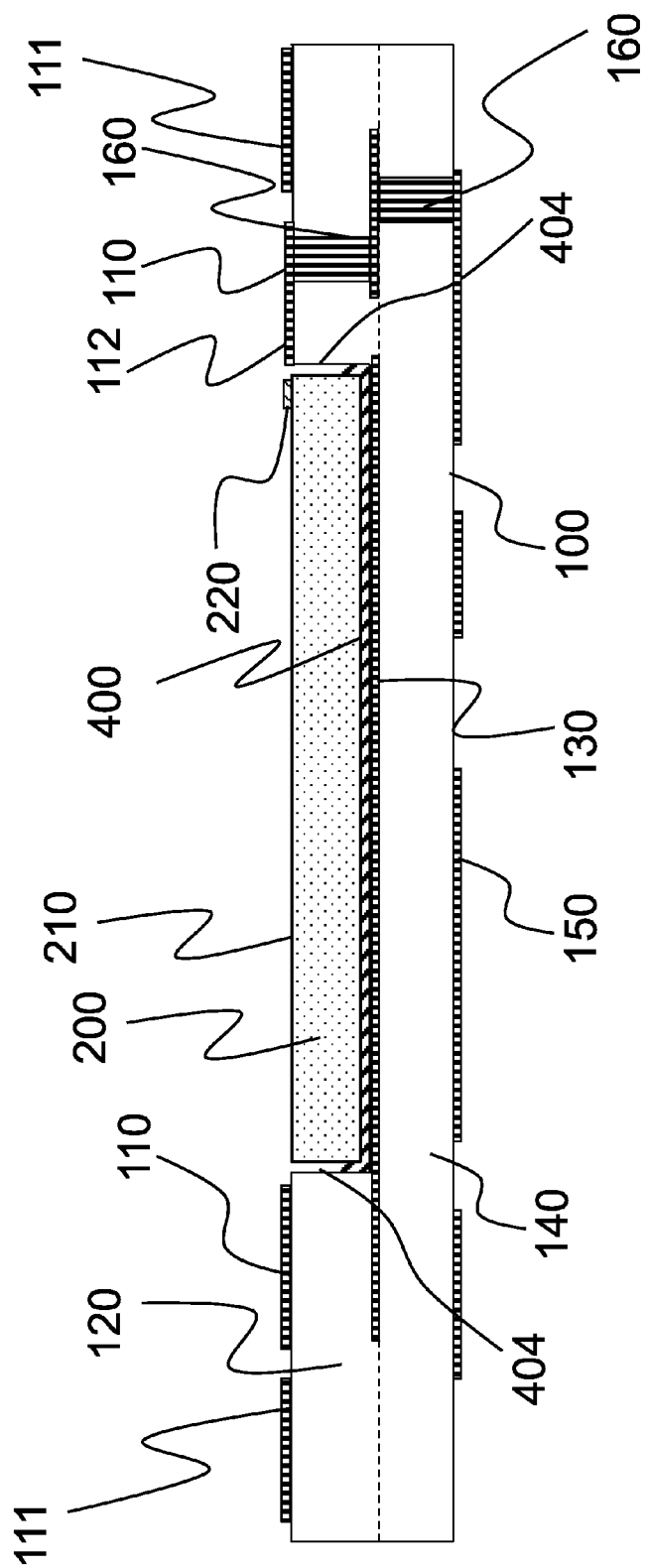
Figure 11:
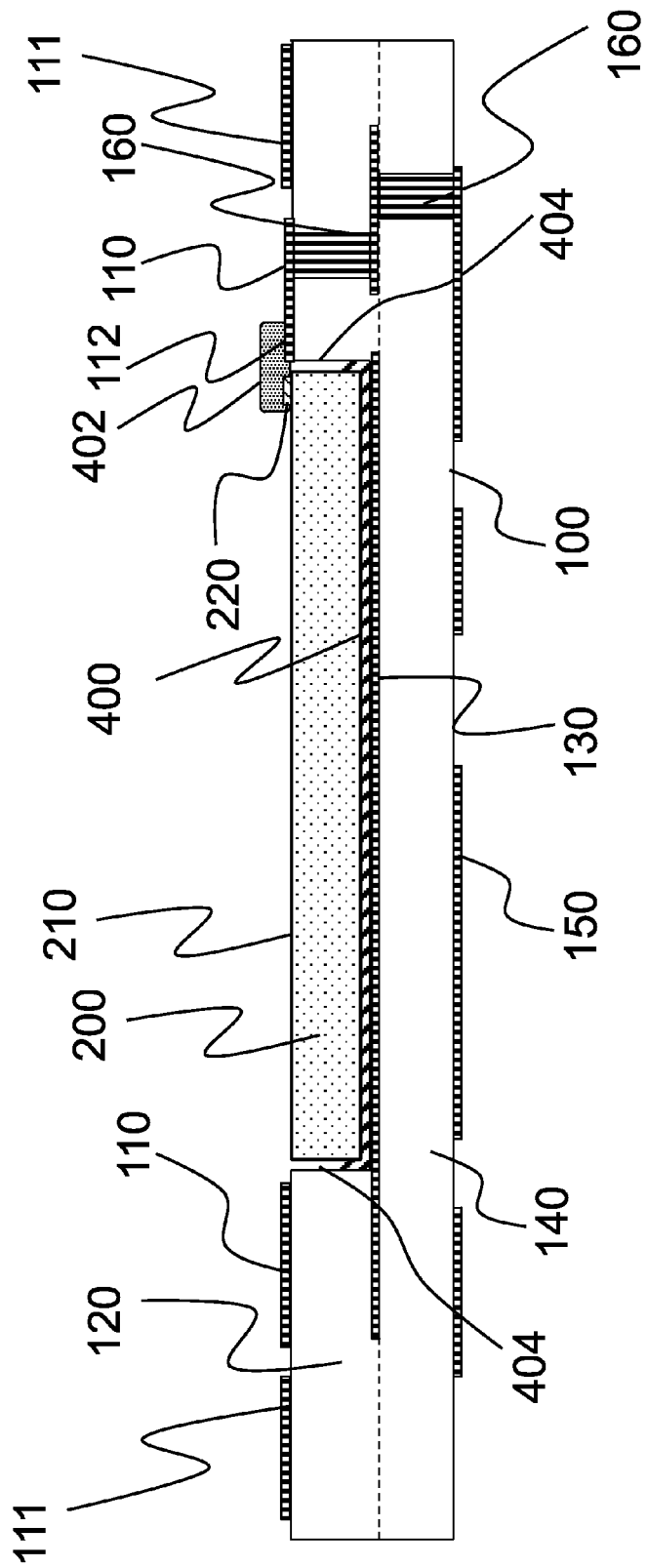
Figure 12:
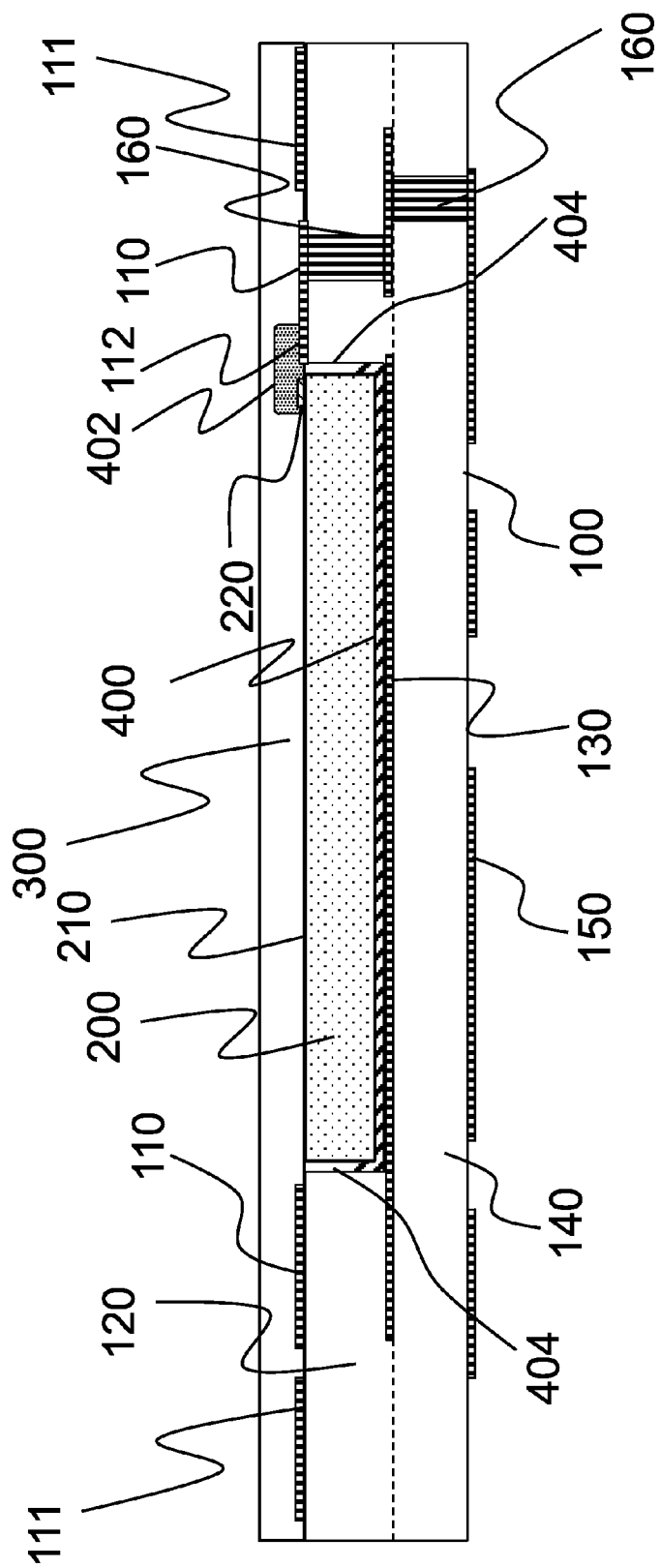

Please refer to FIG. 7. According to the present invention, the image sensing chip 200 has a low-power design with a wake-up function. When the approach of an object 500 is detected by the image sensing chip 200, the image sensing chip 200 wakes up and an excitation signal is sent to the object 500 which has a detected surface 510 being detected by the image sensing chip 200 through the electrode 111. In this embodiment, the image sensing chip 200 is a fingerprint reader sensor chip. Thus, the object 500 refers to a finger while the detected surface 510 contains a fingerprint.

The excitation signal is a capacitively coupled excitation signal sent out from the image sensing chip 200 to the object 500 through the electrode 111. The total area of the electrode(s) 111 should be large enough to provide sufficient signal intensity. Preferably, the total area of the electrode(s) 111 is larger than 20 mm$^2$. In addition, the capacitively coupled excitation signal may reduce the interference of signals at low-frequency (around 60 Hz), further reducing the noise of the output signal of the image sensing chip 200, and prevent the image sensing chip 200 from malfunction.

The first insulation layer 120 is used to separate the first electrically conductive layer 110 from the second electrically conductive layer 130. Meanwhile, the first insulation layer 120 also provides enough hardness to the PCB 100, preventing from breaking off. The first insulation layer 120 has the opening 122 (please refer to FIG. 8) formed therein. The second electrically conductive layer 130 forms a second specific circuit on a portion of a bottom surface of the first insulation layer 120 and a portion of a top surface of the second insulation layer 140.

The second insulation layer 140 basically has the same functions as the first insulation layer 120. It is formed below the second electrically conductive layer 110. A sensor portion 170 is formed on the PCB 100 by combining the opening 122 in the first insulation layer 120 and the second insulation layer 140. The third electrically conductive layer 150 forms a third specific circuit on a portion of a bottom surface of the second insulation layer 140.

The image sensing chip 200 has a number of bonding pads 220 on its top surface. The image sensing chip 200 is fixed in the sensor portion 170 (the opening 122) with each bonding pad 220 connected to one corresponding contact 112. The image sensing chip 200 also has a sensing area 210 facing up to external environment after the image sensing chip 200 is fixed in the sensor portion 170 of the PCB 100.

The PCBA further includes a protection layer 300. The protection layer 300 forms a flat top surface of the PCBA over the image sensing chip 200 and the electrode 111. Please see FIG. 6 again. The protection layer 300 forms over some or all portions of the top surface of the first insulation layer 120 and that of the first electrically conductive layer 110, and on the sensing area 210 of the image sensing chip 200. The protection layer 300 also covers the electrode 111 to insulate the electrode 111 from the object 500, such that the signal sent out from the electrode 111 is capacitively coupled to the object 500. The protection layer 300 is formed by an electrically non-conductive material. Preferably, the electrically non-conductive material is epoxy resin. The protection layer 300 can be also made by organic coating material.

For linkage of some components mentioned above, there are many suitable ways. For example, the bonding pad 220 and the corresponding contact 112 are connected by an electrically conductive material 402. Preferably, silver paste is used as the electrically conductive material 402 for its conductivity. In practice, the electrically conductive material 402 can be a copper paste, nickel paste (thermal cured conductive paste) or even a solder paste. In addition, the bonding pad 220 and the corresponding contact 112 may be connected by metal plating. The electrically conductive material 402 is printed on the area between each bonding pad 220 and the corresponding contact 112, over the top of each bonding pad 220 and that of the corresponding contact 112. Besides, gaps between sidewalls of the first insulation layer 120 and peripherals of the image sensing chip 200 are filled by an electrically non-conductive material 404. Epoxy resin is a good choice for the electrically non-conductive material 404. The electrically non-conductive material 404 can assist to fix the image sensing chip 200 into the opening 122 while no more current leakage may occur.

According to the present invention, the shape of the first opening 122 is similar to that of the image sensing chip 200 but large enough in size so that the image sensing chip 200 can be allocated in the opening 122. This is to reduce the risk that the image sensing chip 200 may slide when a finger exerts force. A step gap between a level of the top surface of the image sensing chip 200 and that of the first insulation layer 120 and/or the first electrically conductive layer 110 after the image sensing chip 200 is fixed in the sensor portion 170 is less than 0.1 mm. Thus, the protection layer 300 can be attached well without being torn off due to a large step gap.

Figure 13:
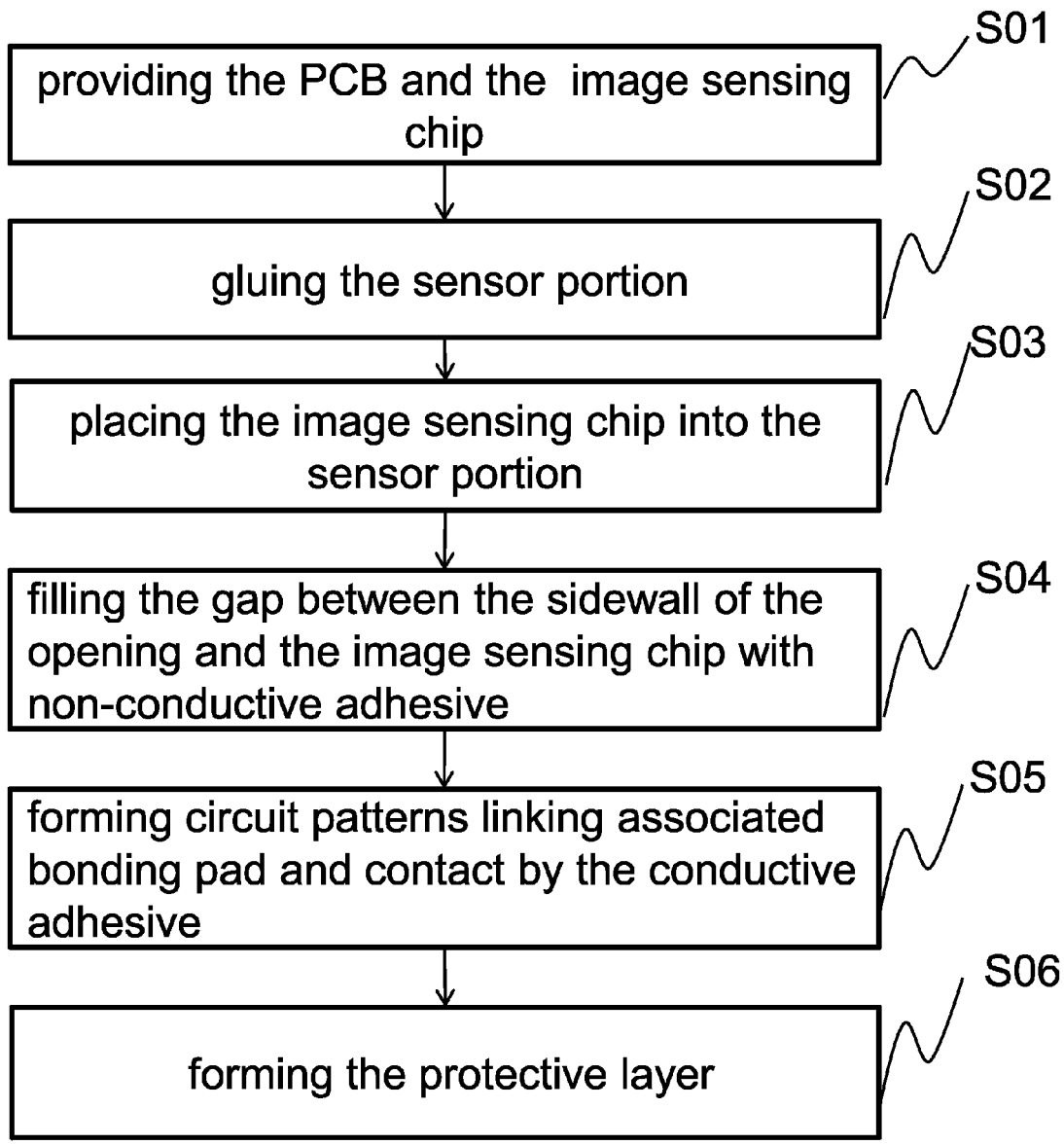
FIG. 13 is a flow chart of the procedure for manufacturing the printed circuit board assembly according to the present invention.

The PCBA has a procedure to manufacture. Please refer to FIG. 8 to FIG. 13 at the same time. FIG. 13 is a flow chart of the procedure for manufacturing the PCBA according to the present invention. FIG. 8 to FIG. 12 are used to illustrate steps in the procedure.

First, provide the PCB 100 having the sensor portion 170, at least one electrode 111, a number of contacts 112 and an image sensing chip 200 having a number of bonding pads 220 (S01). Then, glue the sensor portion 170 with the electrically conductive material 400 (S02). Next, place the image sensing chip 200 into the sensor portion 170 with the sensing area faced up to face the external environment (S03). Afterwards, fill the gaps with the electrically non-conductive material 404 (S04). For the next step, form circuit patterns linking associated bonding pad 220 and contact 112 by electrically conductive material 402 (S05). Finally, form the protection layer 300 over the top surface of the first insulation layer 120 and the sensing area 210 (S06).

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A Printed Circuit Board Assembly (PCBA) forming enhanced fingerprint module, comprising:
    a Printed Circuit Board (PCB), comprising:
    a first insulation layer having an opening formed therein;
    a first electrically conductive layer, forming a first specific circuit on a portion of top surface of the first insulation layer and forming a plurality of contacts; a second electrically conductive layer, forming a second specific circuit or portion of a bottom surface of the first insulation layer; a second insulation layer, formed below the second electrically conductive lay wherein the second specific circuit is formed on a portion of a top surface of i second insulation layer; and
    a third electrically conductive layer, forming a third specific circuit on a portion a bottom surface of the second insulation layer; an image sensing chip, disposed in the opening of the first insulation layer, having sensing area and a plurality of bonding pads peripherally formed on a top surface the image sensing chip for allowing the sensing area to be exposed, when each bonding pad is connected to one of the plurality of contacts;
    at least one electrode, formed close-to or around the opening of the first insulation layer in the first electrically conductive layer, for providing an excitation signal to an object which has detected surface being detected by the image sensing chip; and
    a protection layer, formed completely over the at least one electrode and the surface of the image sensing chip, and formed partially or completely over the surface of the first insulation layer and a top surface of the first electrically conductive layer;
    wherein the opening in the first insulation layer and the second insulation layer together form a recessed sensor portion on the PCB; the protection layer for: flat top surface of the printed circuit board assembly (PCBA) over the image sensing chip and the at least one electrode.

2. The PCBA according to claim 1, wherein the excitation signal is a capacitively coupled excitation signal sent out from the image sensing chip to the object through the at least one electrode.

3. The PCBA according to claim 1, wherein the at least one electrode has a total contact area larger than 20 mm$^2$.

4. The PCBA according to claim 3, wherein the at least one electrode is a metal strip, metal strips, or a metal ring.

5. The PCBA according to claim 1, wherein the bonding pad and a corresponding contact are connected by an electrically conductive material.

6. The PCBA according to claim 5, wherein the electrically conductive material is thermal cured conductive paste or solder paste.

7. The PCBA according to claim 6, wherein the thermal cured conductive paste is silver paste, copper paste, or nickel paste.

8. The PCBA according to claim 1, wherein the bonding pad and a corresponding contact are connected by metal plating.

9. The PCBA according to claim 1, wherein gaps between sidewalls of the opening and peripherals of the image sensing chip are filled by an electrically non-conductive material.

10. The PCBA according to claim 9, wherein the electrically non-conductive material is epoxy resin.

11. The PCBA according to claim 1, wherein the image sensing chip further comprises a metal grid formed therein, for providing ESD protection to the image sensing chip.

12. The PCBA according to claim 1, wherein the protection layer is formed by an electrically non-conductive material.

13. The PCBA according to claim 12, wherein the electrically non-conductive material is epoxy resin.

14. The PCBA according to claim 1, wherein the protection layer is made of organic coating material.

15. The PCBA according to claim 1, wherein the image sensing chip is a fingerprint reader sensor chip.

16. The PCBA according to claim 1, wherein the image sensing chip has a low-power design with a wake-up function.

17. The PCBA according to claim 1, wherein the shape of the first opening is the similar to that of the image sensing chip but large enough in size so that the image sensing chip is able to be allocated in the opening.

18. The PCBA according to claim 1, wherein a step gap between a level of the top surface of the image sensing chip and that of the first insulation layer and/or the first electrically conductive layer after the image sensing chip is fixed into the sensor portion is less than 0.1 mm.

* * * * *